(12) United States Patent
Wibbels et al.

(10) Patent No.: US 11,079,975 B2
(45) Date of Patent: Aug. 3, 2021

(54) HEURISTIC-BASED ACOUSTIC EMISSION AND ENERGY CONSERVATION

(71) Applicant: Hewlett-Packard Development Company, L.P., Spring, TX (US)

(72) Inventors: Mark J Wibbels, Boise, ID (US); Brian C Mayer, Boise, ID (US); Doug Batten, Boise, ID (US); Jeffrey Luke, Boise, ID (US); Dean Richtsmeier, Boise, ID (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/631,222

(22) PCT Filed: Jul. 31, 2017

(86) PCT No.: PCT/US2017/044684
§ 371 (c)(1),
(2) Date: Jan. 15, 2020

(87) PCT Pub. No.: WO2019/027422
PCT Pub. Date: Feb. 7, 2019

(65) Prior Publication Data
US 2020/0142645 A1    May 7, 2020

(51) Int. Cl.
*G06F 3/12* (2006.01)
(52) U.S. Cl.
CPC .......... *G06F 3/1204* (2013.01); *G06F 3/1221* (2013.01); *G06F 3/1257* (2013.01); *G06F 3/1273* (2013.01)

(58) Field of Classification Search
None
See application file for complete search history.

(56) References Cited

U.S. PATENT DOCUMENTS

| | | | |
|---|---|---|---|
| 5,589,923 | A | 12/1996 | Lee et al. |
| 6,236,818 | B1 | 5/2001 | Endo |
| 6,967,733 | B1 | 11/2005 | Minowa |
| 2003/0184799 | A1 | 10/2003 | Ferlitsch |
| 2007/0154230 | A1 | 7/2007 | Choi |
| 2009/0086282 | A1 | 4/2009 | Kim et al. |
| 2012/0013667 | A1 | 1/2012 | Snyder |
| 2014/0043383 | A1 | 2/2014 | Nunokawa et al. |
| 2014/0320876 | A1 | 10/2014 | Ikebata et al. |

(Continued)

FOREIGN PATENT DOCUMENTS

| | | |
|---|---|---|
| CN | 1489044 | 4/2004 |
| JP | H796639 A | 4/1995 |

(Continued)

OTHER PUBLICATIONS

CANON—Reducing the Printer Noise—2015—2 pages http://ugp01.c-ij.com/ij/webmanual/.

*Primary Examiner* — Frantz Bataille
(74) *Attorney, Agent, or Firm* — Mannava & Kang

(57) ABSTRACT

According to an example, a printer may receive an instruction to print a print job of a user and determine parameters of the print job. The printer may perform heuristic analysis of the print job based on the parameters of the print job and previously collected printing heuristic statistics of the user and adjust user printer configurations based on the heuristic analysis.

17 Claims, 4 Drawing Sheets

(56) References Cited

U.S. PATENT DOCUMENTS

2015/0339553 A1* 11/2015 Robinson .............. G06F 3/1257
358/3.24
2017/0163835 A1* 6/2017 Okazawa ........... H04N 1/00973
2018/0284251 A1* 10/2018 Labyed ............... G01S 15/8927

FOREIGN PATENT DOCUMENTS

| | | |
|---|---|---|
| JP | 63250727 B2 | 5/2001 |
| JP | 2002149365 | 5/2002 |
| JP | 2003103875 | 4/2003 |
| JP | 2009113249 | 5/2009 |
| JP | 2010020083 | 1/2010 |
| JP | 2010141670 | 6/2010 |
| JP | 2011155322 | 6/2011 |
| JP | 2012511779 | 5/2012 |
| JP | 2016016528 | 2/2016 |

* cited by examiner

HEURISTIC-BASED ACOUSTIC EMISSION AND ENERGY CONSERVATION

BACKGROUND

Printing systems including those contained within multifunction systems may need optimizations for increasing energy efficiency and reduction in acoustic emissions. Printing systems designers work to minimize the amount of energy used by the fusing system, the consumables, the paper path and finishing devices, and by other electrophotographic printer components. Attempts are made to optimize various mechanical and electro-mechanical elements of the print system in order to minimize acoustic emissions during printing.

BRIEF DESCRIPTION OF THE DRAWINGS

Features of the present disclosure are illustrated by way of example and not limited in the following figure(s), in which like numerals indicate like elements, in which.

DETAILED DESCRIPTION

Figure 1:
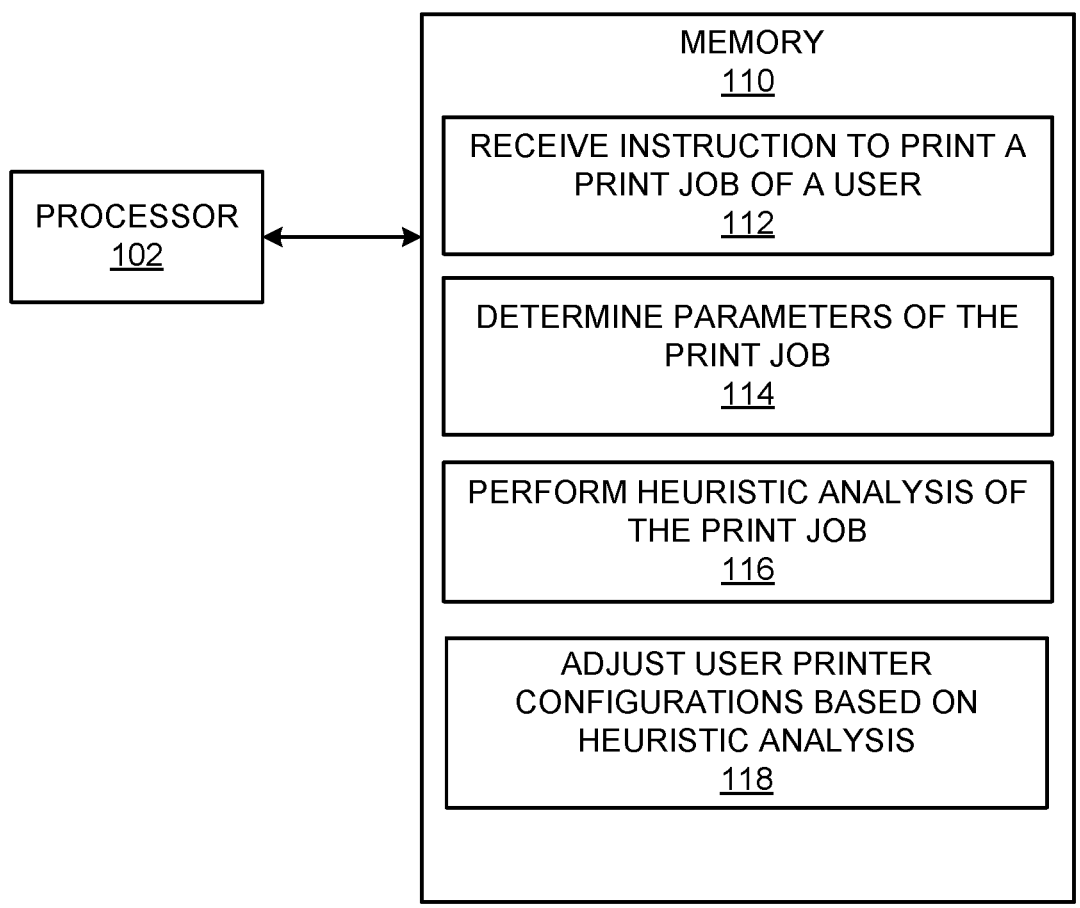
FIG. 1 shows a block diagram of an example printer.

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures readily understood by one of ordinary skill in the art have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

The present disclosure is directed to improving energy efficiency and reducing acoustic emissions of a printing system, such as a multi-purpose printer, using heuristic analyses of the printing system and its users. Usage statistics of a printing system by each user and the subsequent printing system behavior are recorded into a local heuristics log or into a remote database. The heuristic data is constantly updated in order to determine the most suitable printer configuration for each user or a group of users. Whenever a user sends a job for printing, the printer analyzes the heuristic data for this user and sets, on the fly, the optimal printer configurations for executing the print job based on the heuristic data for this user in order to control acoustic emission and energy consumption by the printer while providing sufficient user experience. The heuristic data may be updated in the databases based on the current print job to be used for future analysis.

Printing system designers implement optimizations for energy efficiency and acoustics emissions. These optimizations may need mechanical or electro-mechanical design changes resulting in static performance characteristics of a printer. If the designers want to change these characteristics again, they may need to modify a printing system component or the entire printing system design. Modification of the printing system design may incur costs for redesign, retooling, retest, and requalification. Thus, customer experience modifications may not be achieved without delays and costs associated with these product design revisions. The present disclosure provides a method for managing printer acoustic emissions and energy consumption based on user jobs statistics and associated heuristics of the printer. The present disclosure may eliminate the need for any changes to printer hardware. Thus, the printer functionality may be optimized on the fly without delays and costs associated with hardware-based optimizations.

A printing system may be a multi-purpose printer that includes a scanner.

Acoustic emissions during operation of a printer originate via tonal and impulse noises of the paper path, consumables (toner cartridges, ink cartridges, paper, etc.), fans and motors. Additionally, the printer acoustic emissions may be produced by various non-printing operations such as calibration, cleaning, warmup, spin-down, and engagement/disengagement of the various mechanical elements. Minimizing the acoustic emissions has been a long time goal of printer designers.

Energy consumption of a dry electrophotography (EP) printer may be determined by a time interval used for the printer to enter a power save mode, a time interval used to exit the power save mode, and a time interval used to print from a ready state. The printer energy consumption may be also determined by the page throughput rate (a number of pages moving through the printer within a time unit), energy used to achieve an adequate fusing heat transfer during printing, and by various secondary electrical and mechanical energy consumers within the printer system.

A printer may be optimized for acoustic emissions and energy consumption using print job parameters. The print job parameters may be represented by data characterizing the print job such as, for example, user, application, job source, job length, job type (printing, copying, or scanning), print media type, color or mono print, time of day and location of the print job (pull print, stored print, mobile print, copy job, or personal computer (PC) print). A detailed knowledge of a print job may be used for managing printer acoustic emissions and energy consumption. A printer work history and user preference and behavior may be also used to dynamically optimize both printer acoustic emissions and energy consumption. Acoustics and energy optimization may be applied to a print engine, scanner or a combination of both as well as to output devices.

User interactions with a printer may be described by a set of heuristics, a set of typical behavioral traits as they apply to execution of the user jobs by the printer. The heuristic data may be collected for the user and for the printer to be used later to analyze user jobs in order to adjust user printer configurations based on the previous user print job executions by the printer.

The following are examples of printing heuristics that may be tracked per user: job length (typically how long is each job), job frequency (user prints the job once, repeats multiple times in succession), time between print jobs sessions (when does a user print, how long between sessions), print media type, mono or color printing, time of a day (what time of the day user usually prints?—e.g., just before meetings, just after lunch, just before lunch), job source (pull print, stored job, mobile print, copy job or PC print, user location (does the user usually stand at the printer), job type (print, copy, or scan), time from a last job until media removed from an output tray, estimated number of user jobs left in the output tray, printer calibration frequency and occurrence pattern, printer cleaning frequency and occurrence pattern. The time of the day when the user usually prints may be determined by direct integration with a calendar application having approved secure access based on user credentials contained within the print job. As discussed above, printer heuristics may be used for acoustic emission and energy consumption optimization. For example, sensing, by the printer, that the user is at the device. In this case, the printing would go fast to keep the user from waiting. In one example, if a user or a manager sets the printing mode by pressing a button "Quiet Mode," the printer may print at half speed to reduce acoustic emission and energy consumption. User preferences in terms of quiet (slow) printing or fast (noisy) printing may be used in heuristic analysis.

In one example, if a user job is copy, the printer may operate fast as the user is at the device (unless a quiet mode is selected or mandated by information technology (IT) department or the user has a permission to override IT set configurations). If the user job is print, the printer may operate slow for a short job if no one is there and may operate faster for a long job or with a scaling speed as the job length increases. If the user job is scan, the printer may spin the scanner and apply users' personalized settings of the user who is scanning at the printer to other incoming jobs. For example, a print job may arrive while scanning and the scan user's preference is "quiet" so the job is printed in a quiet mode even if it might normally print in full performance (noisy) mode.

In one example, an energy cost profile may be used for printer configuration. The energy cost profile is a difference in energy cost between daytime and nighttime usage. The printer may detect operational conditions such as ambient light and user presence at the printer. The printer may use this information for selecting, for example, a quiet mode of operation if the light is low. In one example, the printer may detect a presence of a user at the printer by motion detection sensors or by a Bluetooth Low Energy (BLE) device capable of tracking user movements. The printer may select a fast printing mode so the user may print the job quickly. However, the above printer operational conditions data may be used in combination with the collected heuristic data in order to determine an optimal operation mode. Based on the user heuristics data, user preferences, print job parameters, printer operational conditions, and operational heuristics of the printer, the printer behavior may be optimized to modify a user's acoustic experience with a printer and to reduce the printer energy consumption, all while maintaining a pleasing user experience. The acoustics and energy optimization may be applied to a print engine, to a scanner or to a combination of both as well as to output devices.

Examples of possible user behaviors that may be used for heuristic analysis are as follows. User A typically prints jobs from the PC, media output tray is empty when print job is sent, and user A consistently takes over 2 minutes to retrieve the completed print jobs. Current printer behavior for the user A: run a paper path at full speed, all fans turned on at full speed as engine spins up, engine spins up aggressively for fastest possible first page out time. Optimized printer behavior for the user A: based on estimated incoming job length, reduce spin up rate of the laser scanner, set EP process and paper path to ½ speed. At this reduced speed the printer prints with reduced acoustic emissions and consumes less power. The user experience will still meet expectations since the user is not likely to pick up the printed document quickly. Additionally, the printer may track if there are times of the day when the user is more likely to be "in a hurry" and dynamically adjust to print at full speed from the start during that period. This again will maintain a pleasing user experience. A database may maintain information regarding a "distance from printer," which may be dynamically determined by IP address, packet transmission times, and wireless signal strength. Additionally, concepts such as "precede me printing" and ID badges tied into existing tracking systems may also provide location aware optimization of printer acoustics and energy consumption.

In one example, user B typically prints short jobs from power save mode, and retrieves the print jobs as soon as they reach the output bin. Current printer behavior for the user B: run a paper path at full speed, all fans turned on at full speed as engine spins up, engine spins up aggressively for fastest possible first page out time. Optimized behavior of the printer for the user B: jobs less than 4 pages do not need cooling provided by full-speed fans or by the full set of available fans, so leave all or some of the fans off or have them running at a reduced rate to lower acoustic (noise) emissions. If the job is between 4-10 pages, allow fans to turn on or increase speed based on internal engine temperature. Job lengths that extend beyond 10 pages—turn fans on or increase speed at page 10 to maintain thermal control in the print system.

In one example, print job usage data may be used to determine that 99% of the time, users do not pick up their jobs for more than 5 minutes. In this case, several jobs may be collected and printed in a batch just in time to be picked up by the users prior to the 5-minutes limit. This approach may optimize energy use and wear on the printer while meeting user expectations. In one example, an IT department may configure all printing devices for a business to operate in a quiet mode by default for jobs less than 5 pages long. Select users (such as a vice president or a chief executive officer) may be given a permission to override the IT settings. However, any other users have their preferences configured for quiet mode. When the users badge into the printer, the printer configures itself for minimal acoustics. All print jobs that arrive at the printer while that user is signed in are printed at minimal acoustics. Once the user signs out, the printer returns to normal heuristics.

In one example, the following printer behavior optimization may be applied. For a printer that is used enough to warrant a cleaning cycle or calibration, delay this activity until users are not near the device or until a lower cost energy period of the day. This may remove the activity from user perception as well as may limit the impact and cost associated with the activity. Other examples of optimization of the printer behavior may rely on analysis that review printer usage behavior data for one or more users, user preferences, IT settings, job type, energy cost information, time of day, etc. The printer may dynamically adjust to maintain the perception of quiet (low energy) mode while at the same time, delivering on expected performance. Once the printer usage patterns are stored in a local archive or in a remote database, the printer behavior may be optimized to manage acoustics and energy for each user individually and as a group. The database may also be stored in a cloud allowing for sharing of the knowledge across all printers within a company and to centrally control printers' behavior.

With reference first to FIG. 1, there is shown a block diagram of an example printer 100 that may adjust its configuration based on heuristic analysis. It should be understood that the printer 100 depicted in FIG. 1 may include additional components and that some of the components described herein may be removed and/or modified without departing from a scope of the printer 100 disclosed herein.

In one example, the printer 100 may include a processor 102 that may control operations of the printer 100. The processor 102 may be a semiconductor-based microprocessor, a central processing unit (CPU), an application specific integrated circuit (ASIC), a field-programmable gate array (FPGA), and/or other hardware device.

The printer 100 may also include a memory 110 that may have stored thereon machine readable instructions 112-118 (which may also be termed computer readable instructions) that the processor 102 may execute. The memory 110 may be an electronic, magnetic, optical, or other physical storage device that contains or stores executable instructions. The memory 110 may be, for example, Random Access memory (RAM), an Electrically Erasable Programmable Read-Only Memory (EEPROM), a storage device, an optical disc, and the like. The memory 110, which may also be referred to as a computer readable storage medium, may be a non-transitory machine-readable storage medium, where the term "non-transitory" does not encompass transitory propagating signals.

The processor 102 may fetch, decode, and execute the instructions 112 to receive an instruction to print a print job of a user. The processor 102 may fetch, decode, and execute the instructions 114 to determine parameters of the print job of the user. The processor 102 may fetch, decode, and execute the instructions 116 to perform heuristic analysis of the print job based on the parameters of the print job and previously collected printing heuristic statistics of the user. The processor 102 may fetch, decode, and execute the instructions 118 to, adjust user printer configurations based on the heuristic analysis. In one example, the printer 100 may have access to a cloud-based heuristics database to receive data for the heuristics analysis. The printer processor 102 may also receive data for heuristic analysis from a heuristic archive stored in the memory 110.

Figure 2:
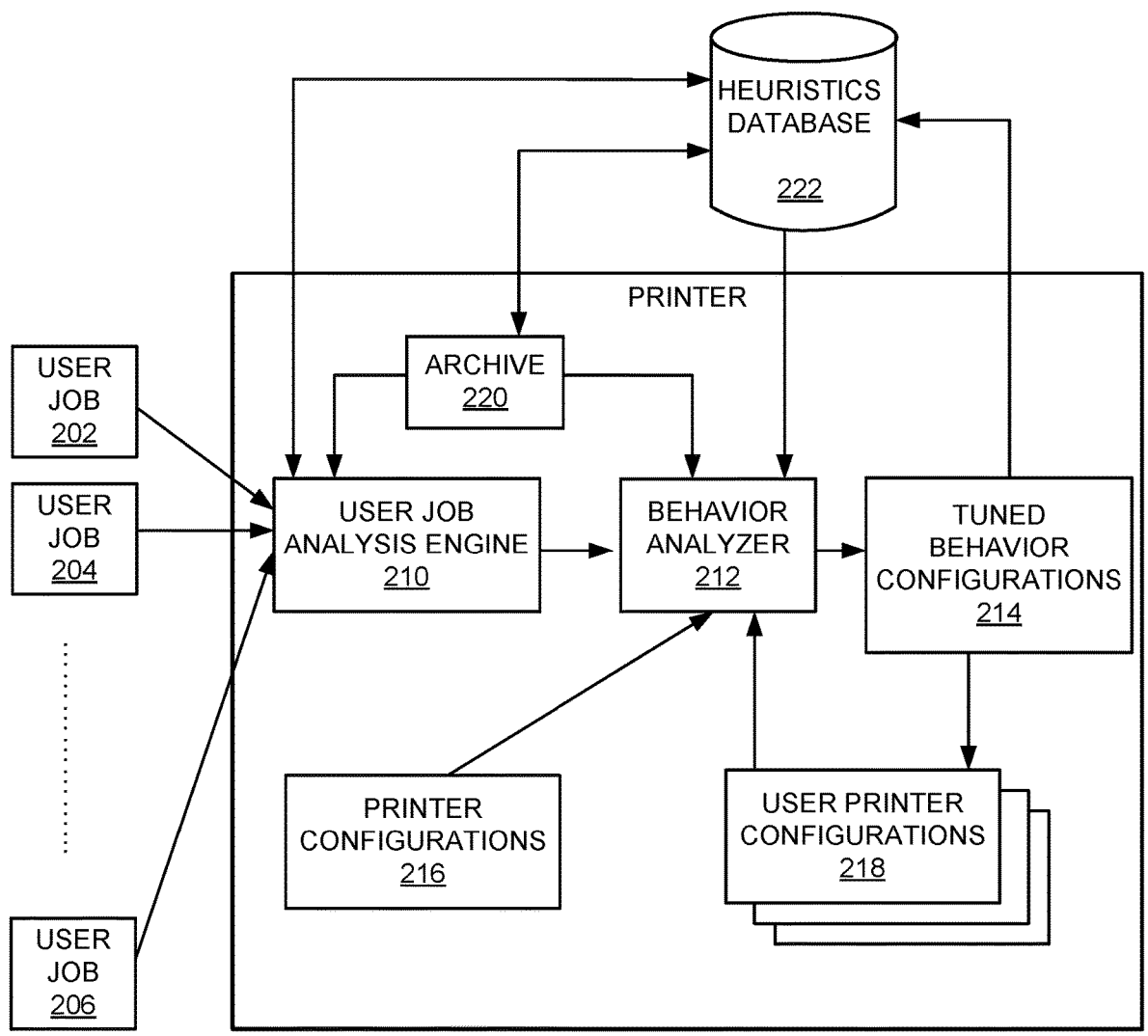
FIG. 2 shows an example printer with heuristic-based acoustic and energy optimization.

Turning to FIG. 2, there is shown an example printer 200 that may adjust user configurations based on tuned behavior configurations. The printer 200 may receive user jobs 202-206 into a user job analysis engine 210. The user job analysis engine 210 may retrieve printing heuristic statistics of the user from local heuristics archive 220. In one example, the user job analysis engine 210 may retrieve printing heuristic statistics of the user from a remote or cloud-based heuristics database 222. The user job analysis engine 210 may analyze the user job based on the retrieved printing heuristic statistics of the user to produce print job parameters. The user job analysis engine 210 may also store the user job parameters into the heuristics archive 220 or to the heuristics database 222 for future reference.

Thus, the printer 200 may collect more user heuristics each time the user sends a job for printing and thereby may continuously "teach" behavior analyzer 212. The behavior analyzer 212 may receive the print job parameters from the user job analysis engine 210. Then, the behavior analyzer 212 may use the user heuristic data from the heuristics archive 220 or the heuristics database 222 to generate tuned behavior configurations 214. In one example, the behavior analyzer 212 may use printer configurations 216 and user printer configurations 218 to generate the tuned behavior configurations 214. If the behavior analyzer 212 determines that the tuned behavior configurations 214 are different from the user configurations 218, the behavior analyzer 212 may adjust the user configurations 218 according to the tuned behavior configurations 214 or may substitute the user configurations 218 with the tuned behavior configurations 214. The behavior analyzer 212 may store the tuned behavior configurations 214 onto the heuristics database 222 for future use. According to examples of the present disclosure, the tuned behavior configurations 214 may control printer acoustic emission and energy consumption.

Figure 3:
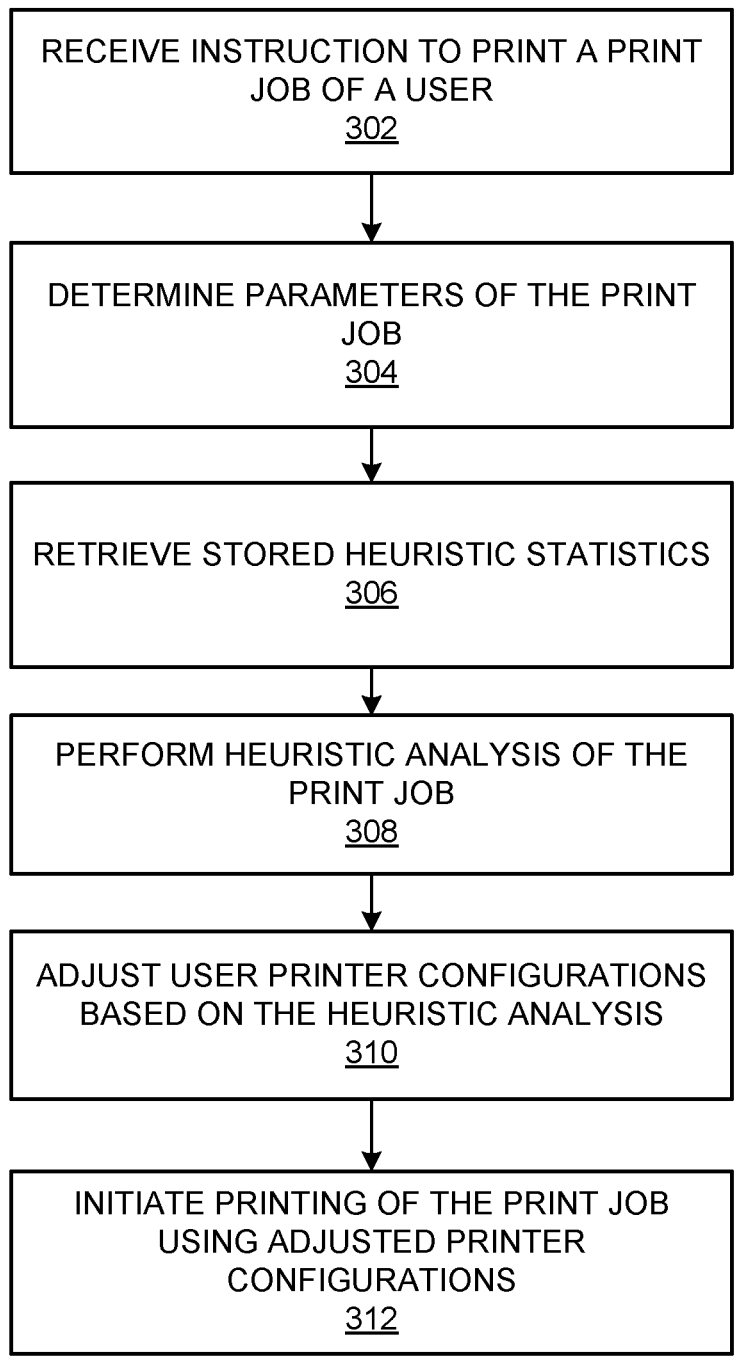
FIGS. 3-4 show diagrams of example methods for heuristic-based acoustic and energy optimization.
Figure 4:
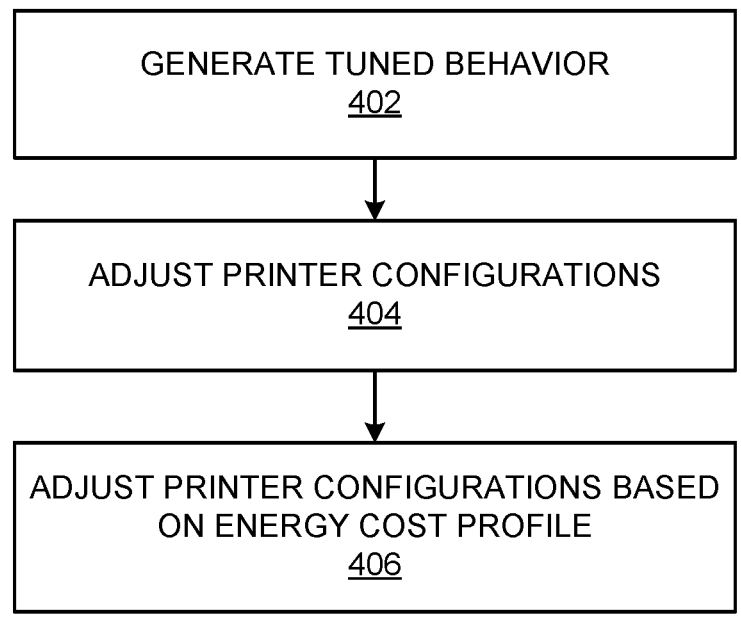

Turning to FIG. 3, there is shown a flow diagram of example method 300 for optimizing printer acoustic emission and energy consumption. The method 300 may be performed by the printer described in FIGS. 1 and 2. At block 302, the processor 102 may execute the instructions to receive an instruction to print a print job of a user. At block 304, the processor 102 may execute the instructions to determine parameters of the print job of the user. At block 306, the processor 102 may execute the instructions to retrieve previously collected and stored printing heuristic statistics of the user. At block 308, the processor 102 may execute the instructions to execute heuristic analysis of the user print job based on the parameters of the print job and the previously collected printing heuristic statistics of the user. At block 310, the processor 102 may execute the instructions to adjust user printer configurations in response to the heuristic analysis. At block 312, the processor 102 may execute the instructions to initiate printing of the print job of the user using the adjusted printer configurations In FIG. 4, there is shown a flow diagram of example method 400 for adjusting user printer configurations based on tuned behavior configurations. At block 402, the processor 102 may execute the instructions to generate tuned behavior configurations based on the heuristic analysis and printer operational conditions. At block 404, the processor 102 may execute the instructions to adjust the user printer configurations, if the user printer configurations are different from the tuned behavior configurations. At block 406, the processor 102 may execute the instructions to adjust the user printer configurations based on an energy cost.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example of the disclosure along with some of its variations. The terms, descriptions and figures used herein are set forth by way of illustration and are not meant as limitations. Many variations are possible within the spirit and scope of the disclosure, which is intended to be defined by the following claims—and their equivalents—in which all terms are meant in their broadest reasonable sense unless otherwise indicated.

What is claimed is:

1. A printer comprising:
a processor; and
a memory on which is stored machine readable instructions that are executable to cause the processor to:
receive an instruction to print a print job of a first user;
determine parameters of the print job of the first user;
retrieve printing heuristic statistics of the first user, wherein the printing heuristic statistics of the first user are statistical data based on printing behaviors of the first user collected during previous print jobs of the first user;
perform a heuristic analysis of the print job based on the parameters of the print job and the retrieved printing heuristic statistics of the first user;
adjust, based on the heuristic analysis, user printer configurations; and cause the processor to print the print job of the first user according to the adjusted user printer configurations.

2. The printer according to claim 1, wherein the printing heuristic statistics of the first user are retrieved from a local heuristics archive.

3. The printer according to claim 1, wherein the printing heuristic statistics of the first user are retrieved from a cloud-based heuristics database.

4. The printer according to claim 1, wherein the machine readable instructions are further executable to cause the processor to adjust the user printer configurations based on an energy cost profile.

5. The printer according to claim 1, wherein the machine readable instructions are further executable to cause the processor to generate tuned behavior configurations based on the heuristic analysis and printer operational conditions.

6. The printer according to claim 5, wherein the machine readable instructions are further executable to cause the processor to adjust the user printer configurations according to the tuned behavior configurations to manage acoustic emission and energy consumption of the printer.

7. The printer according to claim 5, wherein the tuned behavior configurations are further based on user preferences.

8. The printer according to claim 1, wherein the printing behaviors of the first user, upon which the printing heuristic statistics of the first user are based, include time from a last print job of the first user until media being removed from an output tray of the printer.

9. A method comprising:
receiving an instruction to print a print job of a first user;
determining parameters of the print job of the first user;
retrieving printing heuristic statistics of the first user, wherein the printing heuristic statistics of the first user are statistical data based on printing behaviors of the first user collected during previous print jobs of the first user;
performing a heuristic analysis of the print job based on the parameters of the print job and the retrieved printing heuristic statistics of the first user;
adjusting, based on the heuristic analysis, user printer configurations; and
initiating printing of the print job of the first user using the adjusted user printer configurations.

10. The method according to claim 9, further comprising:
generating tuned behavior configurations based on the heuristic analysis and printer operational conditions.

11. The method according to claim 10, further comprising:
in response to the user printer configurations being different from the tuned behavior configurations, adjusting the user printer configurations to the tuned behavior configurations.

12. The method according to claim 11, further comprising:
adjusting the user printer configurations to the tuned behavior configurations based on an energy cost profile.

13. A non-transitory computer readable medium on which is stored machine readable instructions that when executed by a processor, cause the processor to:
receive an instruction to print a print job of a first user;
determine parameters of the print job of the first user;
retrieve printing heuristic statistics of the first user, wherein the printing heuristic statistics of the first user are statistical data based on printing behaviors of the first user collected during previous print jobs of the first user;
perform a heuristic analysis for the print job based on the parameters of the print job and the retrieved printing heuristic statistics of the first user;
adjust printer configurations based on the heuristic analysis; and
initiate printing of the print job according to the adjusted printer configurations.

14. The non-transitory computer readable medium according to claim 13, wherein the machine readable instructions are further executable to cause the processor to:
generate tuned behavior configurations based on the heuristic analysis and printer operational conditions; and
in response to the printer configurations being different from the tuned behavior configurations, adjust the printer configurations to the tuned behavior configurations.

15. The printer according to claim 13, wherein the machine readable instructions are executable to cause the processor to adjust the printer configurations to manage acoustic emission and energy consumption of the printer.

16. The non-transitory computer readable medium according to claim 13, wherein the printing behaviors of the first user, upon which the printing heuristic statistics of the first user are based, include time from a last print job of the first user until media being removed from an output tray of the printer.

17. The method of claim 9, wherein the printing behaviors of the first user, upon which the printing heuristic statistics of the first user are based, include time from a last print job of the first user until media being removed from an output tray of the printer.

* * * * *